(12) United States Patent
Schmidt

(10) Patent No.: US 7,391,499 B2
(45) Date of Patent: Jun. 24, 2008

(54) LITHOGRAPHIC APPARATUS AND DEVICE MANUFACTURING METHOD

(75) Inventor: Robert-Han Munnig Schmidt, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 390 days.

(21) Appl. No.: 11/001,646

(22) Filed: Dec. 2, 2004

(65) Prior Publication Data

US 2006/0119825 A1    Jun. 8, 2006

(51) Int. Cl.
  *G03B 27/52* (2006.01)
  *G03B 27/42* (2006.01)
  *G03B 27/54* (2006.01)

(52) U.S. Cl. .............................. 355/53; 355/55; 355/67

(58) Field of Classification Search .................. 355/53, 355/55, 67, 77; 345/694; 359/290, 298; 356/237.2; 349/4
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2003/0197858 A1* | 10/2003 | Karpol et al. | ............ 356/237.2 |
| 2004/0041104 A1 | 3/2004 | Liebregts et al. | |
| 2004/0130561 A1 | 7/2004 | Jain | |
| 2005/0007572 A1 | 1/2005 | George et al. | |
| 2005/0068467 A1* | 3/2005 | Bleeker et al. | ................. 349/4 |

FOREIGN PATENT DOCUMENTS

| | | |
|---|---|---|
| EP | 0 844 530 A2 | 5/1998 |
| JP | 11-170073 A | 6/1999 |
| WO | WO 98/33096 | 7/1998 |
| WO | WO 98/38597 | 9/1998 |
| WO | WO 02/093254 A1 | 11/2002 |
| WO | WO 03/040829 A2 | 5/2003 |

OTHER PUBLICATIONS

Office Action (including translation), dated May 28, 2007, for JP Patent Application No. 10-2007-0010135, 6 pgs.
Translated Search Report, dated Jan. 17, 2007, for ROC (Taiwan) Patent Application No. 094142299, 3 pages.

* cited by examiner

*Primary Examiner*—Peter B Kim
(74) *Attorney, Agent, or Firm*—Sterne, Kessler, Goldstein & Fox, LLC

(57) ABSTRACT

A lithographic apparatus for reducing the visibility of artifacts in the pattern is provided. The apparatus comprises an illumination system, a patterning device, a projecting system, and a modulating device. The illumination system supplies a beam of radiation. The patterning device patterns the beam. The projection system projects the beam onto a target portion of a substrate. The modulating device modulates the beam to impart the pattern with a modulation scheme.

18 Claims, 5 Drawing Sheets

Figure 4A  Figure 4B  Figure 4C
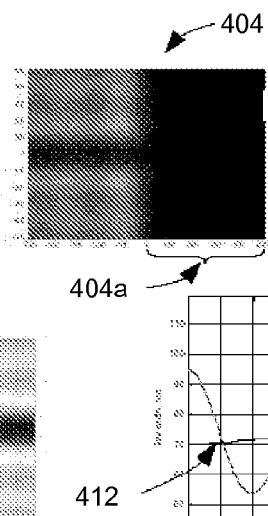
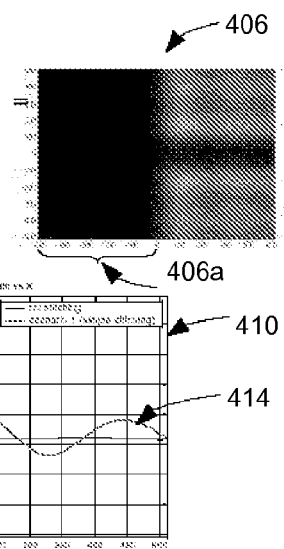
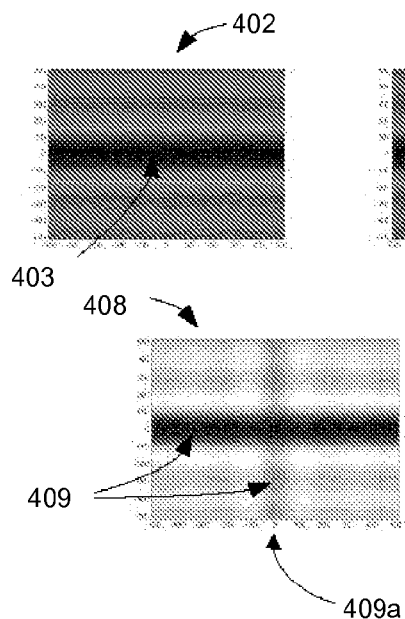
Figure 4D  Figure 4E
Figure 4

LITHOGRAPHIC APPARATUS AND DEVICE MANUFACTURING METHOD

BACKGROUND

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, that is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in that each target portion is irradiated by exposing an entire pattern onto the target portion in one go, and scanners, in that each target portion is irradiated by scanning the pattern through the beam in a given direction (the "scanning" direction), while synchronously scanning the substrate parallel or ant parallel to this direction.

The sequence of exposures, or shots, forms a printed pattern. When considering maskless lithography, each shot results from an image of a spatial light modulator (SLM) array being projected onto a photosensitive surface, such as a wafer substrate. This results in application of a dose, or a quantity of irradiation from a light source, within a certain exposure zone on this surface. Exposure zones are created when the substrate surface is illuminated by flashes of light from the light source. When the pattern extends beyond the boundaries of exposures of a single SLM, the exposures are stitched together along adjacent boundaries to form a completed pattern.

Stitching errors in the printed pattern occur near these boundaries between adjacent exposure zones due to both geometrical misalignments of the exposures and disturbances due to other optical phenomena. Generally, stitching errors occur in printed patterns due to spatial misalignment of the exposure zone on the wafer from its expected position. Optical effects can also create stitching errors, even in cases where the alignment can be perfect. Even a small spatial misalignment of the shots, in the case of a spatial misalignment, can result in a significant perturbation of the printed pattern near the stitching line.

The optical effects can be due to the fact that distribution of the dose within each exposure zone is a result of an exposure by partially coherent light. Since two adjacent exposure zones are exposed at different times, the exposures are effectively incoherent, thus creating the unwanted optical effects. In the example of exposing a substrate to form a flat panel display (FPD), the pixel grid imaging technique used is fully incoherent. The optical errors are caused by different transmission ratios of the optical path for the different regions. A certain area can be brighter than another.

Known techniques attempt to compensate for stitching errors in printed patterns that occur near the stitching line between adjacent exposure zones. A first such technique does not utilize overlap of exposure areas, and involves providing assist features during second, or subsequent, passes of the exposure process. The assist features are added to the pattern data used in irradiating the photosensitive surface, and fill up areas that might otherwise not have received sufficient doses of radiation.

Alternative techniques include compensation spanning overlapping areas of adjacent exposure zones. For example, the SLM can be adjusted, such that a feature to be imprinted on the overlapping region of the photosensitive surface is only printed during one of the multiple exposures for that region. That is, pixels of the SLM that might otherwise be switched "on" during a given exposure to expose a feature are switched "off" by a control system that has determined that an alternative exposure also covering that region will expose that feature instead.

However, such known techniques for compensating for stitching errors inevitably create an area of stitching that will appear different to the no stitched areas of the display. These techniques also require that the substrate be positioned with a very high accuracy in order to align adjacent exposure zones. The dose provided by the illumination source must also be very tightly controlled.

Therefore, what is needed is a system and method to substantially reduce, and possibly eliminate, visibility of a stitched areas and/or to reduce constraints on positioning of a substrate and a dosage control of an illumination source.

SUMMARY

According to an embodiment of the present invention, there is provided a lithographic apparatus comprising an illumination system, a patterning arrangement, a projection system, and a modulating arrangement. The illumination system supplies a beam of radiation. The patterning arrangement patterns the beam. The projection system that projects the beam onto a target portion of a substrate. The modulating arrangement modulates the beam in its cross-section to impart the pattern with a modulation scheme.

In one example, the modulating arrangement can be part of the illumination system.

In one example, the patterning arrangement can comprise an array of individually controllable elements. In another example, the modulating arrangement can comprise the array of individually controllable elements.

In one example, the modulating arrangement can comprise a device disposed in the optical path of the beam of radiation between the illumination system and the substrate. In another example, the modulating arrangement can be disposed between the illumination system and the patterning arrangement. Alternatively, the modulating arrangement can be disposed between the patterning arrangement and the substrate.

The modulating arrangement can apply a predetermined modulation scheme to the beam of radiation. Alternatively, the modulating arrangement can apply a random modulation scheme to the beam of radiation.

The modulating arrangement can modulate the amplitude or the frequency of the beam of radiation. The modulating arrangement can be arranged to apply a modulation scheme to each element of the array of individually controllable elements. The modulating arrangement can comprise a control means for selecting a modulation scheme in accordance with the cross-sectional pattern of the beam of radiation.

The modulating arrangement can be arranged to modulate the beam of radiation in a proportion of its cross-section. The modulating arrangement can be arranged to modulate the beam of radiation only at its periphery.

In accordance with one embodiment of the present invention, there is provided a device manufacturing method comprising the following steps. Patterning the beam with a pattern. Projecting the patterned beam of radiation onto a target portion of a substrate. Modulating the beam of radiation in its cross-section. In one example, the beam can be imparted with a pattern using an array of individually controllable elements.

In one example, the beam of radiation can be modulated prior to the beam being imparted with a pattern. In another example, the beam of radiation can be modulated after the beam has been imparted with a pattern.

In one example, the step of modulating the beam of radiation in its cross-section can comprise modulating the amplitude and/or frequency of the beam of radiation.

Further embodiments, features, and advantages of the present inventions, as well as the structure and operation of the various embodiments of the present invention, are described in detail below with reference to the accompanying drawings.

It is to be appreciated that the Summary sets for one or more exemplary embodiments and/or examples, but not all embodiments and/or examples, of the present invention, and thus should not be seen to be limiting the present invention, or the appended claims, in any way.

BRIEF DESCRIPTION OF THE DRAWINGS/FIGURES

The accompanying drawings, that are incorporated herein and form a part of the specification, illustrate the present invention and, together with the description, further serve to explain the principles of the invention and to enable a person skilled in the pertinent art to make and use the invention.

FIGS. 4a, 4b, 4c, 4d, and 4e are illustrations of the effects of a stitching disturbance of an isolated dark line, according to one embodiment of the present invention.

Figure 5:
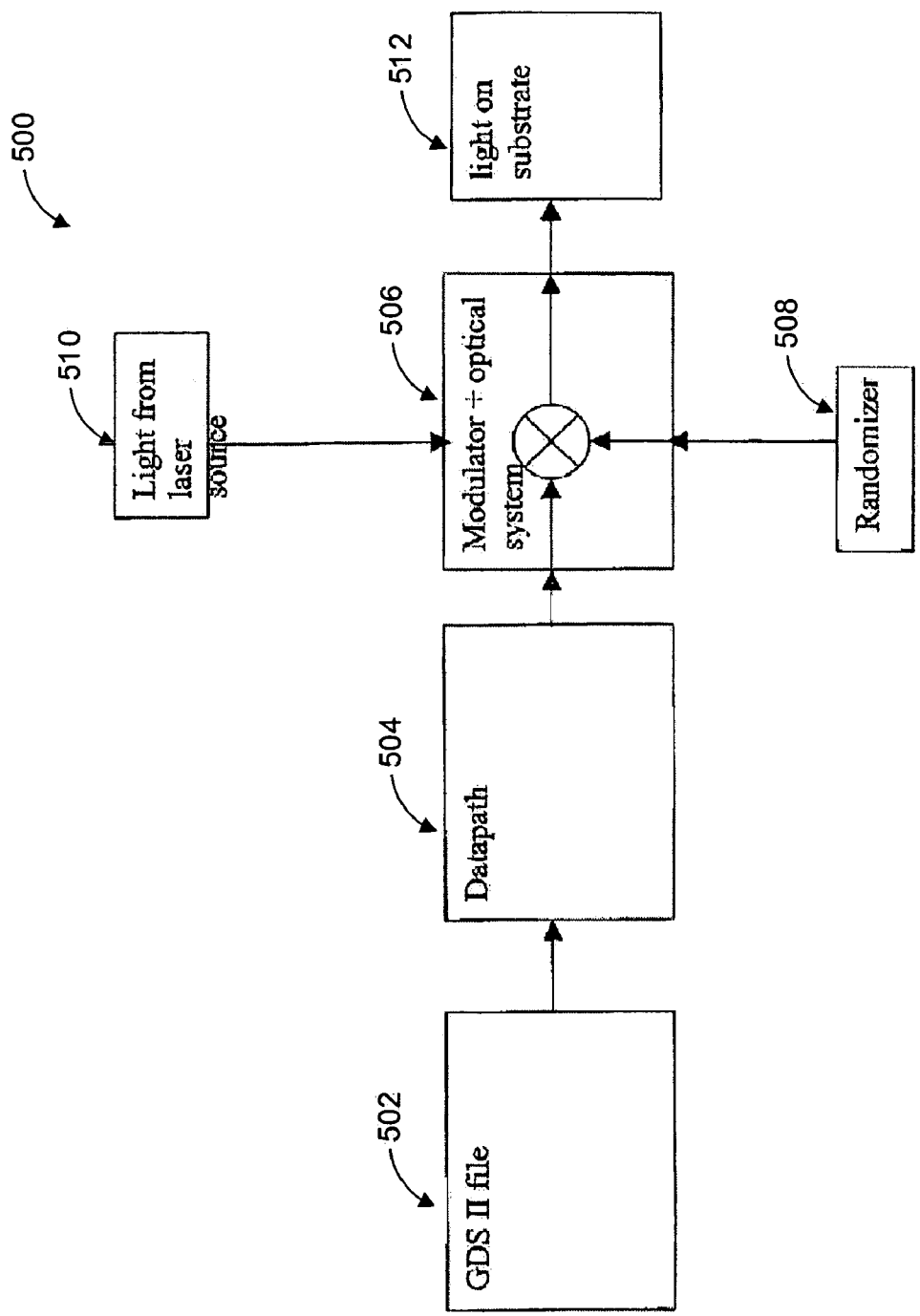

FIG. 5 is a block diagram of a lithographic apparatus, according to one embodiment of the present invention.

The present invention will now be described with reference to the accompanying drawings. In the drawings, like reference numbers can indicate identical or functionally similar elements.

DETAILED DESCRIPTION OF THE EMBODIMENTS

Overview and Terminology

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multilayer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of that can be individually tilted about an axis by applying a suitable localized electric field, or by employing piezoelectric actuation means. Once again, the mirrors are matrix addressable, such that addressed mirrors will reflect an incoming radiation beam in a different direction to unaddressed mirrors; in this manner, the reflected beam is patterned according to the addressing pattern of the matrix addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, that are incorporated herein by reference in their entireties.

A programmable LCD array can also be used. An example of such a construction is given in U.S. Pat. No. 5,229,872, that is incorporated herein by reference in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in that the eventual pattern formed on each part of the substrate is built up over a given period of time or a given number of exposures during that the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multilayer IC, so that the term substrate used herein can also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultraviolet (EUV) radiation (e.g., having a wavelength in the range of 520 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
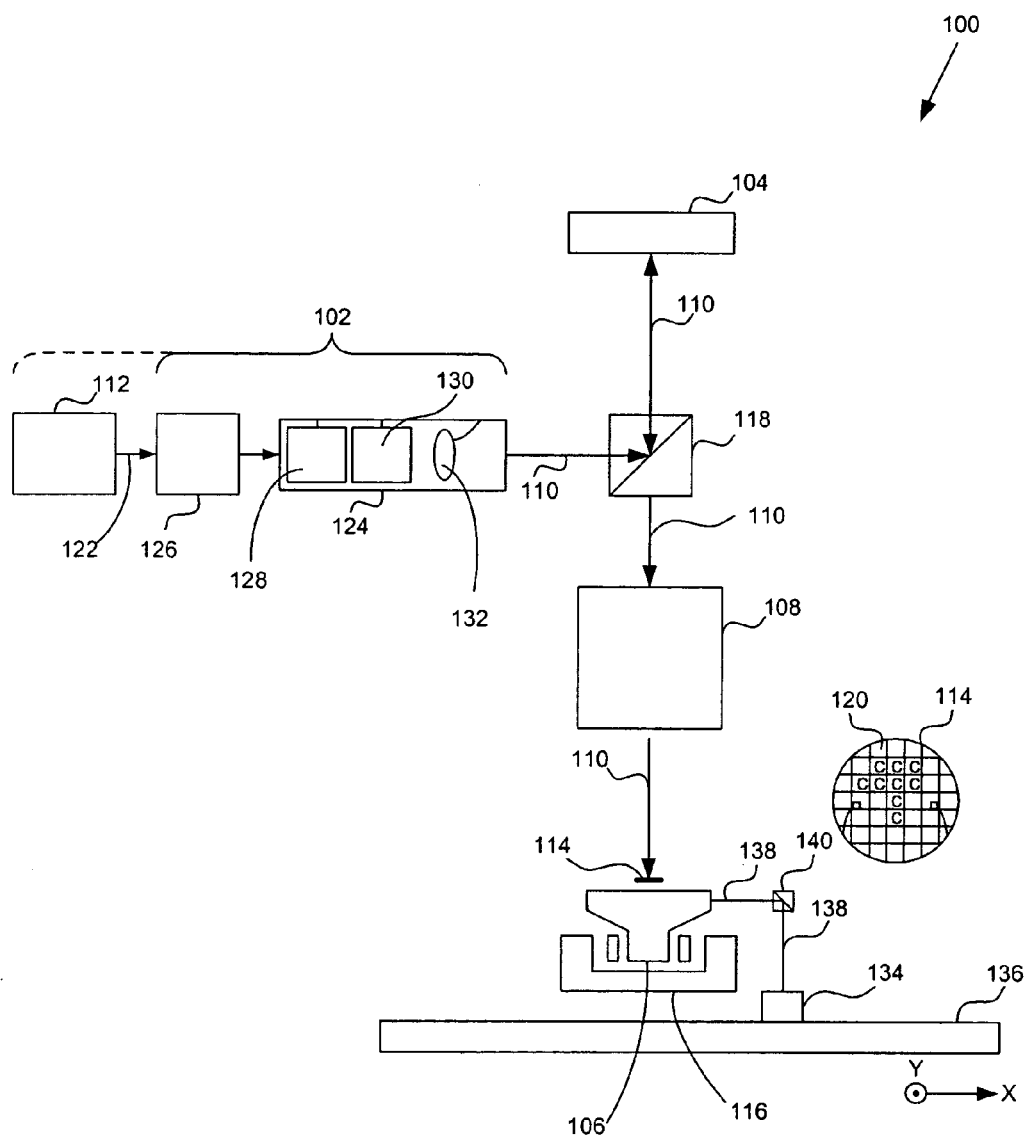
FIG. 1 depicts a lithographic apparatus, according to one embodiment of the present invention.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), that in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for that the elements of the array of individually controllable elements 104 act as shutters. Projection system 108 can also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, that focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long stroke module (course positioning) and a short stroke module (fine positioning), that are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion that is capable of supporting substrate 114. This is conventionally referred to as an air bearing arrangement. Substrate 114 is moved over substrate table 106 using one or more actuators (not shown), that are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in that M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use can also be employed.

Figure 2:
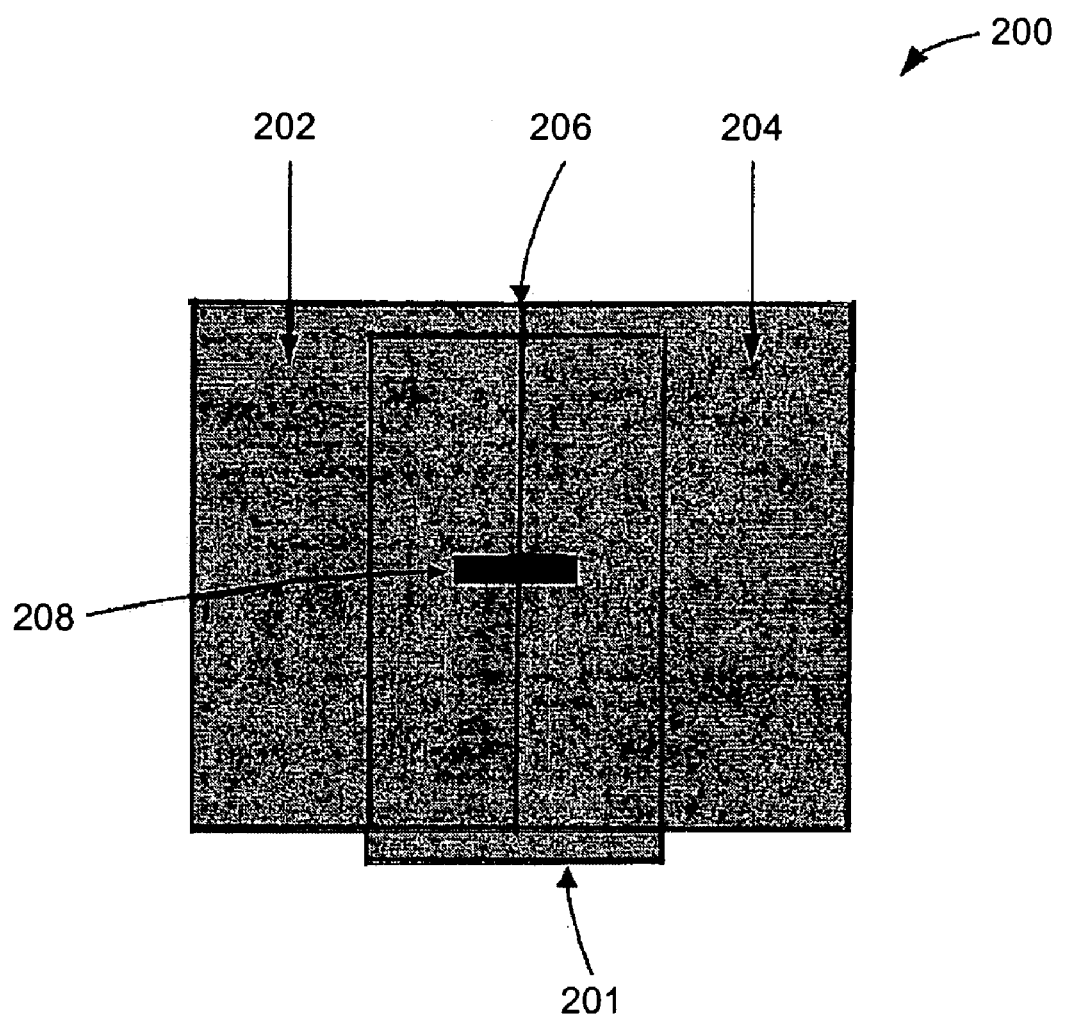
FIG. 2 is an illustration of application of a dose within a number of exposure zones, according to one embodiment of the present invention.

FIG. 2 is an illustration of a formation of a pattern feature that extends across the boundary, or stitching line, of adjacent exposure zones, according to one embodiment of the present invention. A stitched exposure zone 200 includes exposure zones 201, 202 and 204. Each of these exposure zones represents a dose of radiation on a photosensitive surface produced by a single light pulse from an illumination source, for example, an illuminator 102 of FIG. 1. For example, within the duration of a single pulse, a photosensitive surface, such as substrate 114, is moved a predetermined distance resulting in the application of the dose within each of the zones 201, 202 and 204.

An adjacent boundary of exposure zones 202 and 204 forms a stitching line 206. A pattern feature 208 is formed within the exposure zones 201, 202 and 204 and is positioned across the stitching line 206. Optical effects or distortions of the feature 208 can occur due to the fact that the distribution of a dose within each exposure zone is the result of an exposure by a partially coherent light. Subsequently, since the two exposure zones 202 and 204 are exposed at different times, these exposure zones are effectively incoherent.

Figure 3:
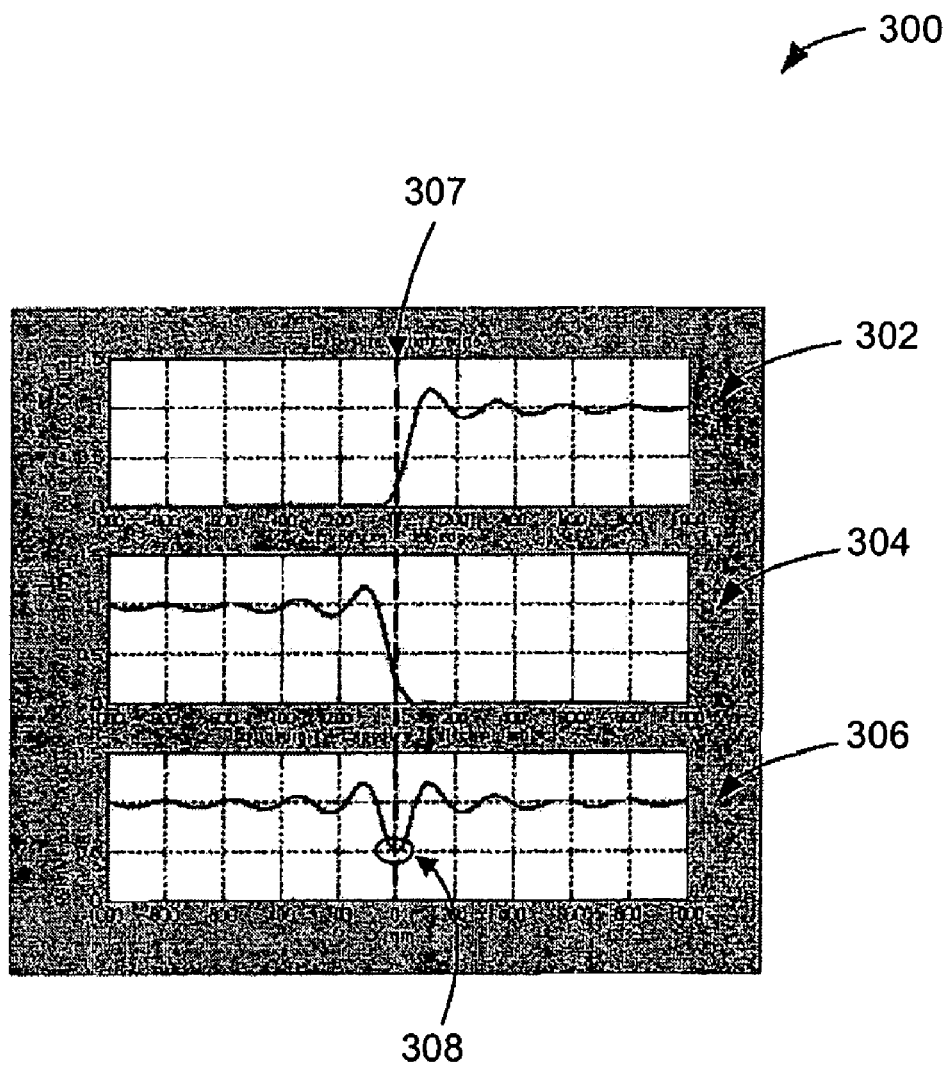
FIG. 3 is a graphical illustration of a stitching disturbance near a stitching line in a desired uniform pattern, according to one embodiment of the present invention.

FIG. 3 is a graphical illustration of a stitching disturbance near a stitching line (e.g., stitching line 206 in FIG. 2, which is represented as line 307 in FIG. 3) in the desired uniform pattern in a scenario where coherent illumination is assumed, according to one embodiment of the present invention. For purposes of illustration, examples of coherent illumination are used because coherent illumination is considered to produce the most significant stitching errors in printed patterns. The present invention, however, is not limited to such an application.

In FIG. 3, a graph 300 illustrates that a uniformly bright field is imaged in two exposures stitched at the origin. A first exposure 302 results from the pixels to the right of the origin in the object plane set to their absolutely bright state, while the object plane field to the left of the origin is zero. The resulting relative intensity distribution (also referred to as the relative dose variation) in the image plane is a diffraction limited image.

A second exposure 304 is a mirror image of the exposure 302 with respect to the origin. It can be seen that the relative dose value (or relative image intensity) at the origin for both exposures is about 25% of that for the case of coherent illumination. A combination of the right edge exposure 302 and the left edge exposure 304 produces an exposure 306 having a relative local dose value of about 50% along a stitching boundary 307. The combination of the exposures at the stitching line 307 with the relative local dose value of about 50% forms a stitching artifact or error 308.

In one example, stitching artifacts, such as the artifact 308, will disturb the morphology of features (e.g., feature 208 of FIG. 2) that are formed across the stitching boundaries, such as the boundary 307. One such morphology disturbance is the occurrence of variations in the line width of lines used to form the printed patterns.

FIGS. 4a, 4b, 4c, 4d, and 4e are illustrations of the effects of a stitching disturbance of an isolated dark line, according to one embodiment of the present invention. These figures are illustrations of the impact stitching errors can have upon line width variation in the absence of stitching error compensation techniques, according to one embodiment of the present invention. FIG. 4 is an illustration of a test case showing the stitching disturbance of an isolated dark line.

In FIG. 4a, an exemplary exposure 402 includes an isolated horizontal dark line 403 on a bright background that is approximately 200 nm long (e.g., about $9\lambda/NA$), where $\lambda$ is the wavelength of the light and (NA) is the numerical aperture. The horizontal dark line 403 is formed by tilting mirror pixels in the object plane.

The line 403 is formed by two adjacent horizontal arrays (rows) of mirrors tilted by $$\alpha_0 = \frac{\lambda}{2L} \text{ and by } -\alpha_0$$

respectively, where $\alpha$ is the tilt angle. The pixels of these rows act almost as absolutely dark pixels. The background is bright and is formed by the pixels with their mirrors being flat. The pattern that forms the line 403 is exposed in three exposures 402, 404 and 406 as shown in FIGS. 4a, 4b, and 4c, respectively. The exposure 402 occurs during the first pass of the substrate, and it exposes the entire line 403. The exposures 404 and 406 are two consecutive exposures during a second pass of the substrate. Each of the two exposures 404 and 406, respectively, expose one half of the dark line 403. Respective dose distributions 404a in FIGS. 4b and 406a in FIG. 4c are shown near a stitching line resulting from each of the three exposures.

FIG. 4d shows a sum 408 of the three exposures. This figure includes an underexposure area 409 along a stitching line 409a.

FIG. 4e shows a graph 410 providing an illustration of variations in the line width near the stitching line 409a. In the example of FIGS. 4a-4e, the line width was computed using an image intensity threshold resulting in a 70 nm line 412. As illustrated in 410, the variation (indicated by line 414) reaches as high as positive (+) 25 nm.

Although stitching errors can create anomalies that significantly degrade printed patterns, at least one embodiment of the present invention provides a technique that removes these problems.

With known stitching techniques, the stitched area is visibly distinct to the non-stitched areas. The known techniques involve tapering the dosage in regions of overlap so as to correspond to the dose intensity in the non-overlapping regions. However, dose differences of more than about 1% are visible as artifacts in the pattern, and slight variation in the tapering can be seen as, for example, a bright line.

As discussed above, according to one or more embodiments of the present invention, the visible artifacts can be removed by modulating the radiation dose. The amplitude and/or the frequency of the radiation can be modulated. The modulation scheme can be a fixed pattern (e.g., harmonic, square, triangle, etc.), but better results are obtained using random modulation (i.e., adding random noise to the optical pattern). The radiation can, for example, be frequency modulated with constant amplitude, or have randomly varying amplitude with a constant or varying frequency. Visible artifacts, such as the straight line mentioned above, can be blurred by the additional noise. The modulation scheme can be tuned to a specific area and have a component that varies with direction.

The introduction of modulation, effectively adding noise to the pattern signal, might at first be considered counterintuitive, since it involves degrading the optimal pattern. However, human visual perception behaves such that the small amount of added noise helps to smooth out otherwise visible artifacts.

In various examples, the modulation can be introduced at various points within the lithographic system. For example, it is possible to modulate the illumination source. One way in that this can be achieved is by inserting a Pockels cell in the light path that changes the polarization, and a polarizer after the Pockels cell. The Pockels cell applies a switchable electric field to the light, resulting in a change of the polarization state. The subsequent polarizer enables direct control of the passing illumination and can thereby provide a very high frequency modulation of the light source.

Modulation at the illumination source is only applicable if the lithography system being adopted uses a common illumination source for all of the optical columns being irradiated on the substrate. Modulation at the source allows the modulation system to be applied to mask-based lithography systems.

In another example, modulation can be effected at any other point in the optical column. When considering a maskless system, modulation is effected at the SLM. Modulation at the SLM, i.e., in the object plane, allows the pattern to be provided to the projection system with the modulation scheme imposed upon it. Modulation at the SLM is achieved by varying the reflection and transmission characteristics of the individual elements of the SLM, for example, where the SLM comprises an array of mirrors, by varying the tilt of the mirrors in accordance with the modulation scheme. When the SLM comprises an array of pixels having only "on" or "off" states, application of the modulation scheme will cause certain of the pixels that should be "on" to be "off," and vice versa.

In one example, modulation is imposed in the optical column. In this example, it can be present across the whole of the pattern or only in the regions of the pattern that are to overlap with adjacent columns. In another example, the modulation scheme can be present across the whole pattern because a wider modulated area gives a less visible difference between adjacent columns.

In a least one or more of the above embodiments and/or examples, the modulation technique makes it possible to reduce the size of the overlapping regions. This can be because a less gradual tapering of the dosage of radiation in the overlapping regions can be used. The blurring introduced by the noise makes the system more tolerant of artifacts in the printed pattern.

In one example, the frequency of the modulation scheme is below the frequency of the illumination, about 40 kHz, so as to be effective. The illumination can be a pulsed source or a continuous source. When using a continuous source, the modulation frequency can be arbitrary, provided that it is high enough with respect to the density of the detail to be patterned.

With a pulsed source, a modulation frequency higher than the pulse frequency will be filtered out or mirrored back around the source pulse frequency to a lower frequency. However, in one example, with modulation occurring at the SLM, each region can be modulated differently. In an example when the source beam is modulated, all spots will have the same light power per pulse. Due to the sparse nature of pixel-grid imaging, this also leads to a random modulation effect.

In one example, when the detail to be patterned is very small, the modulation can be effected at an individual pixel level, varying the characteristics of each pixel in the SLM in accordance with its own modulation scheme. This requires the noise signal to be introduced into the data bus. This removes the characteristic "fingerprint" inherent in each pixel due to its particular qualities, e.g., shape, size, composition. The fingerprint is usually visible on the edges of features or in fine detail.

FIG. 5 illustrates a lithography apparatus 600, according to one embodiment of the present invention. Maskless lithographic apparatus 600 comprises a GDS II file 602 that provides a pattern to be printed onto a substrate via a data path 604 to a modulator and optical system 606. GDS-II is the standard file format for transferring/archiving 2D graphical design data. It contains a hierarchy of structures, each structure containing elements situated on layers. It is a binary format that is platform independent, because it uses internally defined formats for its data types. The pattern data is considered to be contained in a library of cells. Cells may contain geometrical objects such as polygons (boundaries), paths, and other cells. Objects in the cell are assigned to layers of the design. Different layers typically represent different processing steps for exposure on separate mask plates. Geometrical objects may also be tagged with datatypes, which can be used for any purpose, but are most commonly used to group together similarly sized objects for compensation of the proximity effect.

In this embodiment, the modulator is an SLM. In a masked lithography system, the modulator is replaced with a fixed patterned element and lens magnification system. The modulator in a maskless lithography system is arranged to form a patterned configuration in accordance with the information contained within the data file provided. A randomizer 608 alters the pattern data to alter a configuration of the elements of the SLM in a random manner. This can be done using hardware, software, or firmware that generates random data, which is received at a mixer and used to randomize data from datapath 604, as would become apparent to one of ordinary skill in the art upon reading and understand this description. This can slightly alter the desired pattern for printing onto the substrate 612, which effectively applies a random noise modulation to the data file from datapath 604 using the mixer. The illumination source 610 illuminates the SLM, which subsequently illuminates the substrate 612 with the modulated pattern.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A lithographic apparatus comprising:
   an illumination system that supplies a beam of radiation;
   a patterning device that patterns the beam;
   a projection system that projects the beam onto target portions of a substrate; and
   a modulating device that modulates an amplitude of the beam to impart a random modulation scheme on the radiation beam, wherein the random modulation scheme blurs a stitching area between adjacent target portions of the substrate to reduce visibility of a stitching area.

2. The apparatus of claim 1, wherein the modulating device is part of the illumination system.

3. The apparatus of claim 1, wherein the patterning device comprises an array of individually controllable elements.

4. The apparatus of claim 3, wherein the modulating device is arranged to apply the modulation scheme to elements of the array of individually controllable elements.

5. The apparatus of claim 1, wherein the modulating device comprises an array of individually controllable elements.

6. The apparatus of claim 1, wherein the modulating device is disposed in an optical path of the beam of radiation between the illumination system and the substrate.

7. The apparatus of claim 6, wherein the modulating device is disposed between the illumination system and the patterning device.

8. The apparatus of claim 6, wherein the modulating device is disposed between the patterning device and the substrate.

9. The apparatus of claim 1, wherein the modulating device also modulates a frequency of the beam of radiation.

10. The apparatus of claim 1, further comprising:
    a controller that selects the modulation scheme in accordance with the pattern of the beam of radiation.

11. The apparatus of claim 1, wherein the modulating device is arranged to modulate the beam of radiation in a portion of its cross-section.

12. The apparatus of claim 11, wherein the modulating device is arranged to modulate the beam of radiation only at its periphery.

13. A device manufacturing method, comprising:
    patterning a beam of radiation;
    projecting the patterned beam of radiation onto target portions of a substrate; and
    modulating an amplitude of the beam of radiation using a random modulation scheme, wherein the random modulation scheme blurs a stitching area between adjacent target portions of the substrate to reduce visibility of a stitching area.

14. The method of claim 13, wherein the beam is imparted with a pattern using an array of individually controllable elements.

15. The method of claim 13, wherein the beam of radiation is modulated prior to the beam being imparted with a pattern.

16. The method of claim 13, wherein the beam of radiation is modulated after the beam has been imparted with a pattern.

17. The method of claim 13, wherein the step of modulating the beam of radiation comprises also modulating a frequency of the beam of radiation.

18. A lithographic apparatus comprising:
    an illumination system configured to condition a beam of radiation;

a module configured to randomly alter pre-determined pattern data to generate randomized pattern data;

an array of individually controllable elements configured to pattern the beam based on the randomized pattern data; and a projection system configured to project the modulated beam onto target portions of a substrate, wherein the array of individually controllable elements modulates an amplitude of the beam, such that the pattern formed by the pattering device comprises a random modulation scheme that blurs a stitching area between adjacent target portions of the substrate to reduce visibility of a stitching area.

* * * * *